(12) United States Patent
Buchholz

(10) Patent No.: US 9,913,366 B2
(45) Date of Patent: Mar. 6, 2018

(54) PCB TRACE CONNECTION OF ION SMOKE SENSOR

(71) Applicant: Walter Kidde Portable Equipment, Inc., Mebane, NC (US)

(72) Inventor: Matthew J. Buchholz, Canon City, CO (US)

(73) Assignee: WALTER KIDDE PORTABLE EQUIPMENT, INC., Mebane, NC (US)

( * ) Notice: Subject to any disclaimer, the term of this patent is extended or adjusted under 35 U.S.C. 154(b) by 513 days.

(21) Appl. No.: 14/521,740

(22) Filed: Oct. 23, 2014

(65) Prior Publication Data

US 2015/0114687 A1    Apr. 30, 2015

Related U.S. Application Data

(60) Provisional application No. 61/895,633, filed on Oct. 25, 2013.

(51) Int. Cl.
*H05K 1/02* (2006.01)
*H05K 3/30* (2006.01)
*G08B 17/113* (2006.01)

(52) U.S. Cl.
CPC ......... *H05K 1/0219* (2013.01); *G08B 17/113* (2013.01); *H05K 1/0262* (2013.01); *H05K 2201/10151* (2013.01); *Y10T 29/4913* (2015.01)

(58) Field of Classification Search
CPC ...... H05K 3/301; H05K 1/0219; G08B 17/11; G08B 17/113
See application file for complete search history.

(56) References Cited

U.S. PATENT DOCUMENTS 4,631,412 A * 12/1986 Turlej ................. G08B 17/113
250/381
6,168,141 B1  1/2001  Zimmer
6,176,101 B1  1/2001  Lowenstein
6,251,341 B1  6/2001  Zimmer

* cited by examiner

*Primary Examiner* — Timothy Thompson
*Assistant Examiner* — Amol Patel
(74) *Attorney, Agent, or Firm* — Cantor Colburn LLP

(57) ABSTRACT

Embodiments are directed to a method for manufacturing a smoke detector, comprising: manufacturing a substrate that comprises a guard ring configured to surround an ion chamber collector plate pin connection point, a surface mount component connection point, and a trace coupling the ion chamber collector plate pin connection point and the surface mount component connection point, and coupling a surface mount component to the substrate at the surface mount component connection point.

14 Claims, 3 Drawing Sheets

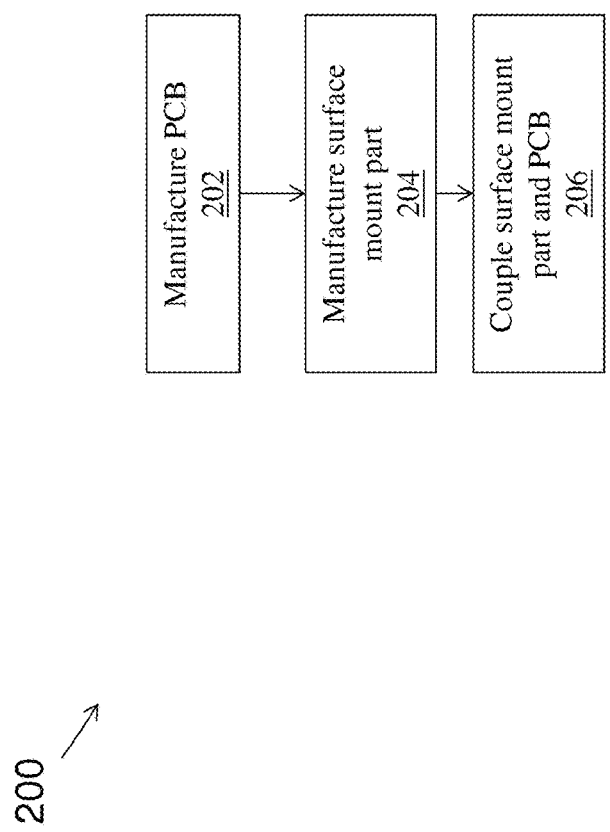

PCB TRACE CONNECTION OF ION SMOKE SENSOR

CROSS-REFERENCE TO RELATED APPLICATIONS

This application claims the benefit of U.S. provisional patent application Ser. No. 61/895,633, filed Oct. 25, 2013, the entire contents of which are incorporated herein by reference.

BACKGROUND

Ion-based smoke detectors include an ionization or ion chamber. The ionization chamber may be located on, or have solder connections to, a printed circuit board (PCB). The ionization chamber (e.g., a collector plate within the ionization chamber) may be coupled to an integrated circuit (IC). The IC may condition and/or process the output of the ionization chamber to determine whether a detected condition (e.g., presence of smoke) should be indicated. For example, the IC may include a comparator that compares the output of the ionization chamber to a reference threshold for purposes of indicating whether excess smoke is present. In some instances, a microcontroller and analog-to-digital converter (ADC) may be used to process the output of the ionization chamber.

Given the low level signaling (e.g., nanoamps, picoamps, etc.) that is used in smoke detector applications, leakage currents pose significant challenges. For example, leakage currents may contaminate the signal output of the ionization chamber if not minimized or controlled. Conventionally, the IC has been fabricated using a dual inline package (DIP). One pin of the DIP is bent up, and a flying lead is soldered between the pin and the ionization chamber. The use of the flying lead helps to avoid leakage that would otherwise result from, e.g., processing/contaminant in connection with the PCB. The bent pin/flying lead configuration effectively serves as an electric fence and guards against leakage, such that the only measurable leakage would be present on the DIP itself.

While the use of the bent pin/flying lead configuration may be effective in reducing leakage, its use imposes additional manufacturing costs and requirements. Moreover, the bending of the pin exposes the IC to a degraded mechanical integrity. Furthermore, technology is generally tending to shift away from DIP and towards surface mount packaging. Continuing to use the bent pin/flying lead configuration associated with DIP will become prohibitively more expensive as fewer DIP ICs are available. Surface mount packages also tend to be smaller or denser than DIP, leading to an increase in leakage current.

BRIEF SUMMARY

An embodiment is directed to a method for manufacturing a smoke detector, comprising: manufacturing a substrate that comprises a guard ring configured to surround an ion chamber collector plate pin connection point, a surface mount component connection point, and a trace coupling the ion chamber collector plate pin connection point and the surface mount component connection point, and coupling a surface mount component to the substrate at the surface mount component connection point.

An embodiment is directed to a printed circuit board of a smoke detector, comprising: a guard ring configured to surround: an ion chamber collector plate pin connection point, a surface mount component connection point, and a trace configured to couple the ion chamber collector plate pin connection point and the surface mount component connection point, and a surface mount component coupled to the printed circuit board at the surface mount component connection point.

Additional embodiments are described below.

BRIEF DESCRIPTION OF THE DRAWINGS

The present disclosure is illustrated by way of example and not limited in the accompanying figures in which like reference numerals indicate similar elements.

FIG. 2 illustrates a flow chart of an exemplary method.

DETAILED DESCRIPTION

Figure 1A:
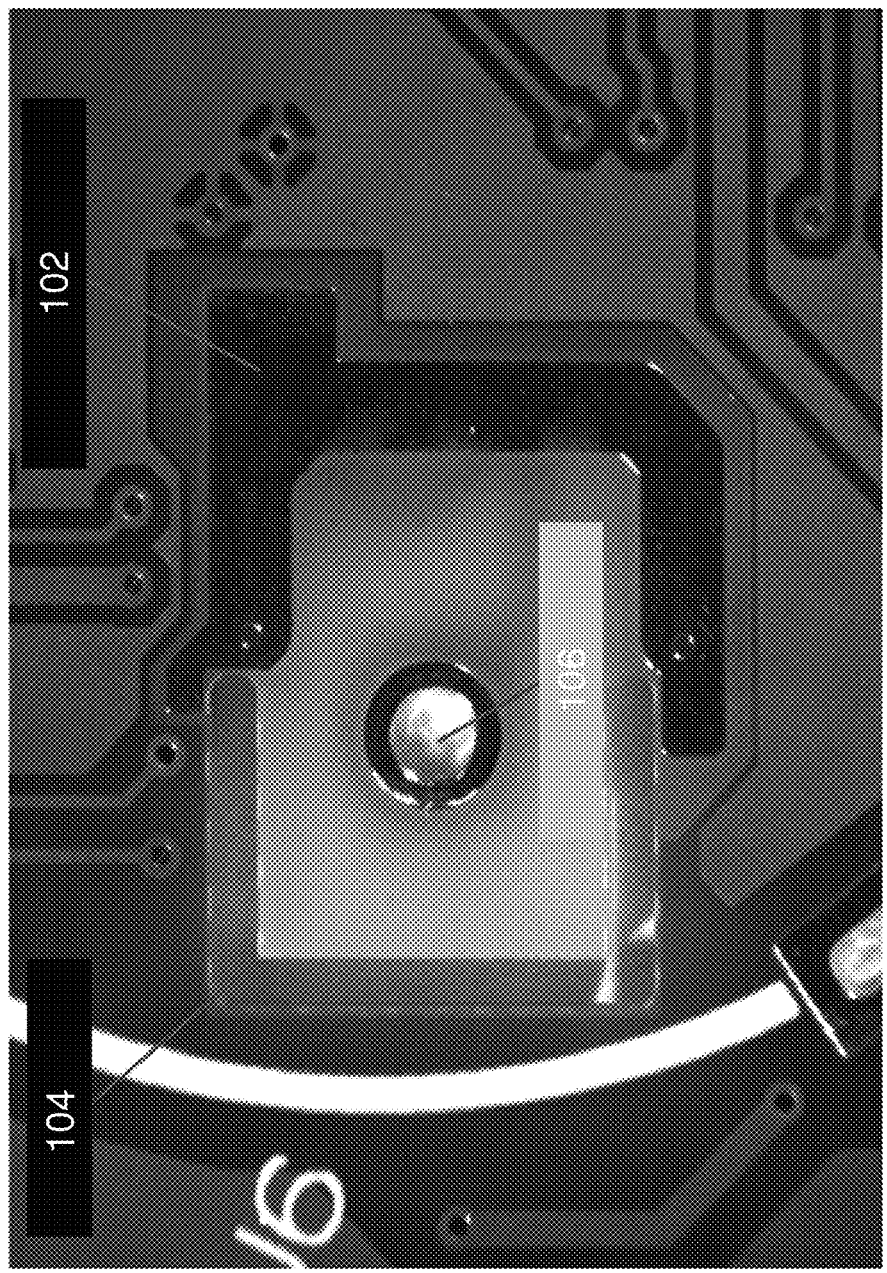
FIGS. 1A-1B illustrate an exemplary printed circuit board (PCB) in accordance with one or more embodiments.

It is noted that various connections are set forth between elements in the following description and in the drawings (the contents of which are included in this disclosure by way of reference). It is noted that these connections in general and, unless specified otherwise, may be direct or indirect and that this specification is not intended to be limiting in this respect. In this respect, a coupling between entities may refer to either a direct or an indirect connection.

Exemplary embodiments of apparatuses, systems, and methods are described for facilitating the use of surface mount parts in connection with a smoke detector. In some embodiments, an ionization chamber, or more specifically a collector plate within the ionization chamber, may be connected to a trace on a printed circuit board (PCB). The PCB trace may also be connected to a surface mount integrated circuit (IC). One or more current guarding techniques may be applied to reduce or minimize leakage current. Leakage may be composed of two parts: (1) surface leakage attributable to contaminates on a surface of a PCB as a result of manufacturing processes, and (2) bulk leakage associated with conduction within a PCB substrate resulting from the quality, purity, and cleanliness of the materials used to build the PCB substrate.

Figure 1B:
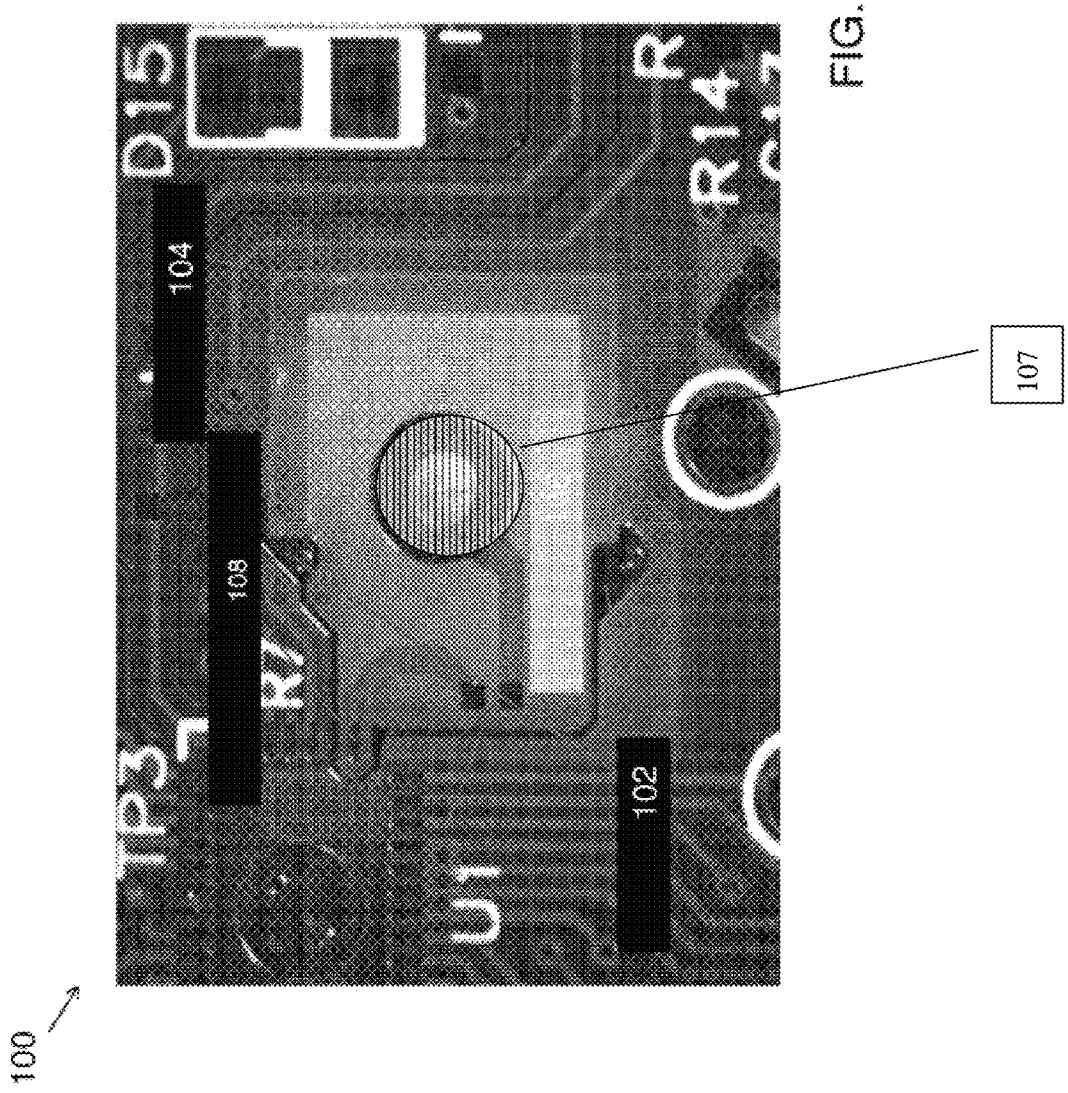

FIGS. 1A-1B (collectively referred to as FIG. 1) illustrate a PCB 100 in connection with one or more embodiments. FIG. 1A may represent a first or front-side of the PCB 100 and FIG. 1B may represent a second or back-side of the PCB 100. Vias may be included in the PCB 100 to couple the first and second sides to one another. In some embodiments, the PCB 100 may be manufactured using FR-4 composite material.

The PCB 100 may include a guard ring trace or guard ring 102. The guard ring 102 may be made of the same material as any other PCB trace.

The PCB 100 may include a hole, trench, or notch 104. The notch 104 may extend completely or partially through the PCB 100.

The guard ring 102 and the notch 104 may be used to control or minimize leakage current as explained further below.

The PCB 100 may include a connection point 106. The connection point 106 may be used to couple the PCB 100 to an ion sensor (not shown in FIG. 1).

The PCB 100 may include a connection point 108. The connection point 108 may be used to couple the PCB 100 to a component or device, such as a surface mount IC.

As described above, the guard ring 102 may be used to minimize leakage current. The guard ring 102 may surround the ion chamber collector plate connection point 106, an associated PCB trace, and the surface mount connection point 108 to eliminate PCB leakage current to the ion chamber collector plate pin and PCB trace.

The notch 104 may be used to minimize leakage current. The notch 104 may create an air gap or 'moat' to eliminate PCB leakage current to the ion chamber collector plate pin and PCB trace.

In some embodiments, one or more guard source connection points may be placed on the surface mount (IC) package itself. Doing so may help to minimize leakage current from adjacent surface mount connection points to the ion chamber collector plate connection point 106.

In some embodiments, the guard ring 102, the ion chamber collector plate connection point 106, an ion chamber collector plate trace going to the surface mount (IC) part, and/or the surface mount (IC) part may be covered with a moisture/contamination barrier 107. The barrier may be composed of wax or other similar conformal coating. The barrier may be used to help minimize leakage current.

Turning now to FIG. 2, a flow chart of an exemplary method 200 is shown. The method 200 may be executed in connection with one or more systems, components, or devices, such as those described herein (e.g., the PCB 100). The method 200 may be used to couple a surface mount component, part, package, or IC to an ionization chamber of a PCB (or more generally, a substrate).

In block 202, the PCB may be manufactured. The PCB may include one or more connection points (e.g., connection points 106 and 108). The PCB may include one or more traces to couple the surface mount part and the ionization chamber. The PCB may include a guard ring. The PCB may include a notch.

In block 204, the surface mount part may be manufactured. The surface mount part may include guard source connection points to minimize leakage current from adjacent surface mount connection point to the ionization chamber.

As part of block 202 and/or block 204, a moisture/contamination barrier may be included in connection with the PCB and/or surface mount part, respectively.

In block 206, the surface mount part may be coupled to the PCB. For example, the surface mount part may be soldered to the PCB as part of block 206.

The method 200 is illustrative. In some embodiments, one or more of the blocks or operations (or a portion thereof) may be optional. In some embodiments, the blocks or operations may execute in an order or sequence that is different from what is shown. In some embodiments, additional blocks or operations not shown may be included.

Embodiments of the disclosure facilitate the use of surface mount parts in connection with a smoke detector or sensor, such as an ion-based smoke detector. Use of surface mount parts may eliminate a production or manufacturing requirement of manually bending and soldering an integrated circuit (IC) lead to a collector plate.

Embodiments of the disclosure may be used to extend the operational capabilities of a smoke detector. For example, reduced sensitivity to leakage currents may allow the smoke detector to operate reliably at elevated temperatures or humidity levels relative to conventional smoke detectors.

Embodiments of the disclosure may be applied in connection with one or more applications or contexts. Some of the examples described herein related to smoke detectors, such as ion-based smoke detectors. Aspects of the disclosure may be applied to other types of detectors, such as carbon monoxide detectors. Aspects of the disclosure may be applied in environments where it is important to ensure signal fidelity, particularly where leakage or contamination might otherwise have an appreciable impact on the quality of the signal.

As described herein, in some embodiments various functions or acts may take place at a given location and/or in connection with the operation of one or more apparatuses, systems, or devices. For example, in some embodiments, a portion of a given function or act may be performed at a first device or location, and the remainder of the function or act may be performed at one or more additional devices or locations.

Embodiments may be implemented using one or more technologies. In some embodiments, an apparatus or system may include one or more processors, and memory storing instructions that, when executed by the one or more processors, cause the apparatus or system to perform one or more methodological acts as described herein. For example, manufacture of a printed circuit board may be automated in accordance with the above. Various mechanical components known to those of skill in the art may be used in some embodiments.

Embodiments may be implemented as one or more apparatuses, systems, and/or methods. In some embodiments, instructions may be stored on one or more computer-readable media, such as a transitory and/or non-transitory computer-readable medium. The instructions, when executed, may cause an entity (e.g., an apparatus or system) to perform one or more methodological acts as described herein.

Aspects of the disclosure have been described in terms of illustrative embodiments thereof. Numerous other embodiments, modifications and variations within the scope and spirit of the appended claims will occur to persons of ordinary skill in the art from a review of this disclosure. For example, one of ordinary skill in the art will appreciate that the steps described in conjunction with the illustrative figures may be performed in other than the recited order, and that one or more steps illustrated may be optional.

What is claimed is:

1. A method for manufacturing a smoke detector, comprising:
   manufacturing a substrate that comprises a guard ring configured to surround an ion chamber collector plate pin connection point, a surface mount component connection point, and a trace coupling the ion chamber collector plate pin connection point and the surface mount component connection point; and
   coupling a surface mount component to the substrate at the surface mount component connection point;
   wherein the substrate comprises a notch that is configured to eliminate leakage current to the ion chamber collector plate pin connection point and the trace.

2. The method of claim 1, wherein the substrate comprises a printed circuit board.

3. The method of claim 1, further comprising:
   coupling an ionization chamber to the substrate at the ion chamber collector plate pin connection point.

4. The method of claim 1, further comprising:
   manufacturing the surface mount component.

5. The method of claim 1, wherein the surface mount component comprises at least one guard source connection point configured to minimize leakage current from adjacent surface mount connection points to the ion chamber collector plate pin connection point.

6. The method of claim 1, further comprising:
   covering at least one of the guard ring, the ion chamber collector plate pin connection point, an ion chamber collector plate trace going to the surface mount component, and the surface mount component with a moisture/contamination barrier.

7. The method of claim 6, wherein the moisture/contamination barrier comprises a conformal coating.

8. A printed circuit board of a smoke detector, comprising:
a guard ring configured to surround: an ion chamber collector plate pin connection point, a surface mount component connection point, and a trace configured to couple the ion chamber collector plate pin connection point and the surface mount component connection point;
a surface mount component coupled to the printed circuit board at the surface mount component connection point; and
a notch configured to eliminate leakage current to the ion chamber collector plate pin connection point and the trace.

9. The printed circuit board of claim 8, further comprising:
a collector plate of an ionization chamber coupled to the printed circuit board at the ion chamber collector plate pin connection point.

10. The printed circuit board of claim 8, wherein the surface mount component is an integrated circuit.

11. The printed circuit board of claim 10, wherein the integrated circuit is configured to condition an output signal of the ionization chamber.

12. The printed circuit board of claim 8, wherein the surface mount component comprises at least one guard source connection point configured to minimize leakage current from adjacent surface mount connection points to the ion chamber collector plate pin connection point.

13. The printed circuit board of claim 8, further comprising:
a moisture/contamination barrier configured to cover at least one of the guard ring, the ion chamber collector plate pin connection point, an ion chamber collector plate trace going to the surface mount component, and the surface mount component.

14. The printed circuit board of claim 13, wherein the moisture/contamination barrier comprises wax.

\* \* \* \* \*